United States Patent
Mitsui

(10) Patent No.: US 6,596,135 B1
(45) Date of Patent: Jul. 22, 2003

(54) SPUTTERING TARGET, TRANSPARENT CONDUCTIVE FILM, AND METHOD FOR PRODUCING THE SAME

(75) Inventor: Akira Mitsui, Kanagawa (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 09/622,069

(22) PCT Filed: Mar. 4, 1999

(86) PCT No.: PCT/JP99/01046

§ 371 (c)(1),
(2), (4) Date: Aug. 31, 2000

(87) PCT Pub. No.: WO99/45163

PCT Pub. Date: Sep. 10, 1999

(30) Foreign Application Priority Data

Mar. 5, 1998 (JP) ............................................ 10-053899

(51) Int. Cl.$^7$ ................................................ C23C 14/34
(52) U.S. Cl. ........................... 204/192.29; 204/298.13; 428/702
(58) Field of Search ....................... 204/298.12, 298.13, 204/192.15, 192.22, 192.26, 192.28, 192.29; 136/256, 265; 428/702

(56) References Cited

U.S. PATENT DOCUMENTS

| | | | | |
|---|---|---|---|---|
| 5,236,632 A | * | 8/1993 | Ogawa et al. | ............... 252/518 |
| 5,352,300 A | * | 10/1994 | Niwa | .......................... 136/256 |
| 5,458,753 A | | 10/1995 | Sato et al. | |
| 5,532,062 A | | 7/1996 | Miyazaki et al. | |
| 5,736,267 A | | 4/1998 | Mitsui et al. | |
| 6,146,765 A | | 11/2000 | Mitsui et al. | |

FOREIGN PATENT DOCUMENTS

JP   6-290641   * 10/1994

OTHER PUBLICATIONS

Translation of 6–290641.*

* cited by examiner

*Primary Examiner*—Rodney G. McDonald
(74) *Attorney, Agent, or Firm*—Oblon, Spivak, McClelland, Maier & Neustadt, P.C.

(57) ABSTRACT

A sputtering target which comprises an oxide containing Zn, Al and Y, which can be used for a DC sputtering method, and with which a transparent conductive film having a resistivity of from $10^{-2}$ to $10^{10}$ Ω·cm can be produced stably, and a transparent conductive film which comprises an oxide containing Zn, Al and Y, and which has a resistivity of from $10^{-2}$ to $10^{10}$ Ω·cm and a low light absorptivity.

8 Claims, No Drawings

SPUTTERING TARGET, TRANSPARENT CONDUCTIVE FILM, AND METHOD FOR PRODUCING THE SAME

TECHNICAL FIELD

The present invention relates to a sputtering target, a transparent conductive film and a method for producing the same.

BACKGROUND ART

It is considered preferable to interpose zinc oxide type transparent conductive film between an amorphous Si layer and an Ag film as a back surface electrode of an amorphous solar cell, from the viewpoint of durability and photoelectric conversion efficiency.

However, the light absorptivity tends to be high (i.e. the light transmittance tends to decrease), when it is attempted to obtain an oxide type transparent conductive film having a low resistivity. Of a conventional zinc oxide type transparent conductive film, although the resistivity is low, the transmittance of light (particularly the transmittance of light having a wavelength of from 400 to 1000) is not high.

On the other hand, of an oxide type transparent conductive film having a low light absorptivity (i.e. a high light transmittance), the resistivity tends to be high. Accordingly, it has been difficult to obtain an oxide type transparent conductive film having a resistivity of from $10^{-2}$ to $10^{10}$ $\Omega \cdot cm$ and having a low light absorptivity.

In a case of forming an oxide type transparent conductive film having a resistivity of from $10^{-2}$ to $10^{10}$ $\Omega \cdot cm$ by a sputtering method, it has been conventionally known to carry out sputtering by using a target having such an electrical conductivity that the resistivity of the target itself is from $10^{-1}$ to $10^{10}$ $\Omega \cdot cm$, at a low oxygen concentration such that the oxygen in the atmosphere is at most 3 vol %.

However, this method is limited to a high-frequency sputtering material, as the electrical conductivity of the target is poor. Accordingly, a direct current (DC) sputtering method can not be used which is excellent in industrial productivity such that the structure of the equipment is simple, whereby the operation efficiency is high, and the rate of film formation is high.

It is preferred to use a target of low resistance having a resistivity of at most $10^{-1}$ $\Omega \cdot cm$ when the DC sputtering method is employed, since stable discharge can be obtained.

However, in the case of forming a film by the DC sputtering method by using a ZnO type target of low resistance having a resistivity of from $10^{-1}$ to $10^{-1}$ $\Omega \cdot cm$, in an atmosphere of a low oxygen concentration (e.g. an argon gas alone), only a transparent conductive film of low resistance having a resistivity of a level of $10^{-4}$ $\Omega \cdot cm$ will be obtained (JP-A-2-149459).

In order to obtain a film having a resistivity of from $10^{-2}$ to $10^{10}$ $\Omega \cdot cm$ by using a target having a low resistivity of at most $10^{-1}$ $\Omega \cdot cm$, it is required to introduce an oxidative gas (such as oxygen gas) into the atmosphere so as to carry out the sputtering at a high oxygen concentration.

However, the oxidative gas in the atmosphere may affect also the transparent conductive film to be formed, and the transparent conductive film may be damaged, such being problematic.

Accordingly, a method has been desired to produce a transparent conductive film having a resistivity of from $10^{-2}$ to $10^{10}$ $\Omega \cdot cm$, by using the DC sputtering method which is excellent in productivity, in an atmosphere of a low oxygen concentration in which the transparent conductive film is less likely to be damaged.

It is an object of the present invention to provide a sputtering target which can be used for the DC sputtering method, and with which a transparent conductive film having a resistivity of from $10^{-2}$ to $10^{10}$ $\Omega \cdot cm$ can be stably produced.

Further, it is an object of the present invention to provide a zinc oxide type transparent conductive film having a low light absorptivity, and its production method.

Still further, it is an object of the present invention to provide a zinc oxide type transparent conductive film having a resistivity of from $10^{-2}$ to $10^{10}$ $\Omega \cdot cm$, and its production method.

DISCLOSURE OF THE INVENTION

The present invention provides a sputtering target comprising an oxide containing Zn, Al and Y (hereinafter referred to as ZAY target).

By using the ZAY target, a transparent conductive film having a low light absorptivity (having substantially no coloring) will be obtained without introducing a reactive gas such as oxygen during sputtering (e.g. by an argon gas alone).

The resistivity of the ZAY target is preferably at most $10^{-1}$ $\Omega \cdot cm$. If it is higher than $10^{-1}$ $\Omega \cdot cm$, the discharge during the DC sputtering tends to be unstable.

By using the ZAY target, an oxide type transparent conductive film having a resistivity of from $10^{-2}$ to $10^{10}$ $\Omega \cdot cm$ will be obtained stably.

The ZAY target contains preferably from 0.2 to 15.0 atomic % of Al and from 0.2 to 75.0 atomic % of Y, based on the total amount of Zn, Al and Y, since a transparent conductive film having a resistivity of from $10^{-2}$ to $10^{10}$ $\Omega \cdot cm$ will be obtained more stably. Particularly, in order to obtain a transparent conductive film having a resistivity of from $10^{-2}$ to $10^{4}$ $\Omega \cdot cm$, the ZAY target contains preferably from 0.2 to 8.0 atomic % of Al and from 0.2 to 20.0 atomic % of Y, more preferably from 0.2 to 8.0 atomic % of Al and from 0.2 to 10.0 atomic % of Y, based on the total amount of Zn, Al and Y.

In a case of an oxide target containing from 0.2 to 15.0 atomic % of Al based on the total amount of Zn, Al and Y, and containing no Y, when the DC sputtering is carried out in an atmosphere at a low oxygen concentration (e.g. an argon gas alone), of the obtained transparent conductive film, the resistivity will be less than $10^{-2}$ $\Omega \cdot cm$, however, the light absorptivity tends to be high.

Further, in a case of an oxide target containing from 0.2 to 75.0 atomic % of Y based on the total amount of Zn, Al and Y, and containing no Al, the target will have a high resistance (exceeding $10^{-1}$ $\Omega \cdot cm$), whereby the DC sputtering tends to be difficult. Further, in a case of using, instead of Al, B of the same Group 3 of Periodic Table, the target tends to be poor in moisture resistance.

By properly adjusting the amount of Al and Y, a transparent conductive film having a desired resistivity of from $10^{-2}$ to $10^{10}$ $\Omega \cdot cm$ will be obtained.

Further, the atomic ratio of Y/Al in the ZAY target is preferably from 0.1 to 25. If the atomic ratio of Y/Al is less than 0.1, the light absorptivity of the obtained transparent conductive film tends to be high. On the other hand, if the atomic ratio of Y/Al exceeds 25, the resistivity of the obtained transparent conductive film tends to exceed $10^{10}$ $\Omega \cdot cm$.

The method for producing the ZAY target is not particularly limited, and a common method for sintering ceramics such as atmospheric pressure sintering method or a hot pressing method may be employed.

The atmospheric pressure sintering method is preferred since a sintered body (target) can be produced at a low cost without using a huge equipment such as a vacuum equipment.

The ZAY target can be obtained, for example, by mixing each powder of alumina, yttria and zinc oxide as materials to obtain a powder mixture, filling the powder mixture in a mold for pressing, followed by press molding by a press machine or a rubber press machine (or molding by plaster casting), and then sintering the obtained molded product at from 1400 to 1550° C. in the air.

If it is less than 1400° C., the sintering degree will be poor, whereby no dense target will be obtained. Further, if it is higher than 1550° C., the evaporation from the sintered body will be active, and pores in the sintered body will be enlarged by the vaporized gas, whereby the density tends to decrease. The holding time during sintering is preferably from 1 to 10 hours. If it is shorter than 1 hour, the sintering tends to be inadequate, whereby no dense product tends to be obtained. Further, if it is longer than 10 hours, the amount of evaporation tends to be large, whereby the density tends to decrease.

The density of the ZAY target is preferably at least 85% as a relative density, since stable discharge can be obtained.

Another element other than Al and Y may be added to the ZAY target. As said another element, lanthanoid such as La or Ce, or Sc, may, for example, be mentioned.

The ZAY target preferably has a $Y_3Al_5O_{12}$ phase as a garnet structure. By formation of the $Y_3Al_5O_{12}$ phase, solid solution of Y in large quantities in ZnO can be suppressed, and as a result, decrease in electrical conductivity can be suppressed.

Further, the $ZnAl_2O_4$ phase as a spinel structure is preferably as little as possible. The electrical conductivity tends to be high when the formation of the $ZnAl_2O_4$ phase is little, and when Al is solid-solved in ZnO. Concretely, the peak intensity of the (311) face in the $ZnAl_2O_4$ phase is smaller than the peak intensity of the (101) face of the $Y_3Al_5O_{12}$ phase, in a powder X-ray diffraction analysis.

The present invention further provides a method for producing a transparent conductive film, which comprises sputtering a sputtering target, wherein the ZAY target is used as the sputtering target.

The sputtering atmosphere is preferably such an atmosphere that the content of an oxidative gas is at most 3 vol %. An atmosphere of an inert gas such as an argon gas alone may also be employed.

If the content of an oxidative gas in the atmosphere exceeds 3 vol %, the oxidative gas in the atmosphere may re-sputter the formed transparent conductive film, whereby the transparent conductive film may be damaged.

As the oxidative gas in the present invention, a gas having oxygen atoms such as $O_2$, $H_2O$, CO or $CO_2$, may be mentioned.

As a sputtering method, any discharge system such as a DC system or a high frequency system may be carried out, however, preferred is a DC sputtering method having a simple equipment structure and thereby having a good operation efficiency, having a high rate of film formation and being excellent in industrial productivity.

As a substrate on which the film is formed, glass, ceramics, a plastic or a metal may, for example, be mentioned. The temperature of the substrate during film formation is not particularly limited. Further, after the film formation, the substrate may be subjected to after-heating (heat treatment).

The present invention further provides a transparent conductive film comprising an oxide containing Zn, Al and Y (hereinafter referred to as ZAY film).

The ZAY film contains preferably from 0.2 to 15.0 atomic % of Al and from 0.2 to 75.0 atomic % of Y, based on the total amount of Zn, Al and Y, since a desired resistivity will be obtained with a high reproducibility. Particularly, it is preferred to contain from 0.2 to 8.0 atomic % of Al and from 0.2 to 60.0 atomic % of Y.

In order to obtain a resistivity of from $10^{-2}$ to $10^4$ Ω·cm, it is particularly preferred to contain from 0.2 to 8.0 atomic % of Al and from 0.2 to 20.0 atomic % of Y, based on the total amount of Zn, Al and Y.

Further, from the viewpoint of light absorptivity, the sum of Al and Y is preferably at least 3.5 atomic %, particularly preferably at least 5 atomic %, based on the total amount of Zn, Al and Y.

In a case where from 0.2 to 15.0 atomic % of Al is contained based on the total amount of Zn, Al and Y, and no Y is contained, the resistivity tends to be less than $10^{-2}$ Ω·cm, and the light absorptivity tends to be high.

Further, in a case where from 0.2 to 75.0 atomic % of Y is contained based on the total amount of Zn, Al and Y, and no Al is contained, the resistivity tends to exceed $10^{10}$·cm. Further, in a case where B of the same Group 3 of Periodic Table is used instead of Al, the film tends to be poor in moisture resistance.

By properly adjusting the amount of Al and Y, a ZAY film having a desired resistivity of from $10^{-2}$ to $10^{10}$ Ω·cm will be obtained.

The atomic ratio of Y/Al in the ZAY film is preferably from 0.1 to 25. If the atomic ratio of Y/Al is less than 0.1, the light absorptivity tends to be high. On the other hand, if the atomic ratio of Y/Al exceeds 25, the resistivity tends to exceed $10^{10}$ Ω·cm. From the viewpoint of resistivity, the atomic ratio of Y/Al is particularly preferably at most 5.

From the viewpoint of light absorptivity, the atomic ratio of Y/Al is preferably at least 0.5, particularly preferably at least 1.0.

Another element other than Al and Y may be added to the ZAY film. As said another element, lanthanoid such as La or Ce, or Sc, may, for example, be mentioned.

The film thickness (geometrical film thickness) of the ZAY film is preferably from 5 nm to 1.5 μm. If it is thinner than 5 nm, no continuous film tends to be obtained. Further, if it is thicker than 1.5 μm, the cost tends to increase, and at the same time, peeling is likely to occur. From the viewpoint of light absorption, the film thickness is particularly preferably from 5 to 200 nm.

With the ZAY film, a relatively high resistivity of from $10^{-2}$ to $10^{10}$ Ω·cm can be easily achieved, and it is suitable for an application, for example, which requires a high sheet resistance value of from $10^3$ to $10^{11}$ Ω/□. It is particularly suitable for a transparent heating element to obtain a desired heat value. The electrical conductivity in the vicinity of the electrode area is practically very important, and the electrical conductivity in the vicinity of the electrode is sufficient with a resistance of from $10^3$ to $10^{11}$ Ω/□, and the current can be stably applied to the film (the film can stably be used), and extraordinary heat generation in the vicinity of the electrode can be prevented.

Further, if the resistivity of the ZAY film is lower than $10^{-2}$ Ω·cm, the film thickness is required to be thin in order to obtain a desired sheet resistance value (e.g. from $10^3$ to $10^{11}$ Ω/□), and accordingly, problems such as breakage of the film are likely to arise.

On the other hand, if the resistivity of the ZAY film is higher than $10^{10}$ Ω·cm, the film thickness is required to be thick in order to obtain a desired sheet resistance value (from $10^3$ to $10^{11}$ Ω/□), and accordingly, the cost tends to increase.

The present invention further provides a transparent conductive film-bonded substrate which comprises a substrate and a ZAY film formed on the substrate. Specific examples of the transparent conductive film-bonded substrate having a ZAY film formed thereon, include the above-described transparent heating element, a solar cell (as described hereinafter) and a touch panel.

When the ZAY film is used as a base film for another transparent conductive film, and another transparent conductive film is laminated on said ZAY film, the crystallinity of the transparent conductive film laminated on the ZAY film can be adjusted. Namely, in the ZAY film, the C axis of the zinc oxide crystal is aligned perpendicular to the substrate, which may affect the crystallinity of the transparent conductive film laminated on the ZAY film. The transparent conductive film laminated on the ZAY film will be affected by the crystal alignment of the ZAY film as the base film, and will be a transparent conductive film having a high crystallinity due to a phenomenon similar to epitaxial growth. This is particularly remarkable in a case where the transparent conductive film laminated on the ZAY film is a zinc oxide type transparent conductive film.

Further, as a result of increase in crystallinity, influence of moisture remaining in the vacuum (contamination) will be suppressed during film formation, and besides, characteristics such as electrical conductivity and durability tend to be better.

Further, in the case where the ZAY film is used as the base film, when the substrate is soda lime glass, diffusion of alkali ions from the substrate can be prevented, and when the substrate is a plastic film, evaporation or diffusion of a solvent or a low molecular weight substance contained in the film can be prevented.

Further, in a case where the ZAY film is used as an overcoat film for another transparent conductive film, it works as a protective layer to prevent invasion of moisture or oxygen from the air. Further, by lamination with another transparent conductive film, the internal stress of the laminated film can be reduced, and the breakage of the film can be reduced.

As mentioned above, when the ZAY film is used as the base film and/or overcoat film, the electrical conductivity of another transparent conductive film will be maintained for a long period of time. For example, in a case where the ZAY film and another transparent conductive film are combined (laminated) to constitute a transparent conductive film-bonded substrate, the change in the sheet resistance value of said transparent conductive film-bonded substrate will be small even after a long period of time.

In the ZAY film, as the carrier electron concentration in the film is reduced by addition of Y, the absorption of light at the visible light and near infrared regions due to carrier electrons is small, and as a result, the light transmittance can be increased. Further, by addition of Y, the defect level (interstitial zinc) in the ZAY film can be reduced, whereby an action such that the bandgap becomes narrow due to the defect level can be suppressed, and as a result, the light absorption of visible light on the near ultraviolet ray side (from 380 to 500 nm) can be reduced, whereby the light transmittance can be increased.

The absorptivity ((absorptivity)=100−(transmittance)−(reflectance)) of the ZAY film at each wavelength of from 400 to 1000 nm is preferably at most 4% (extruding the absorption of the substrate). If it is higher than 4%, the light absorption is significant, such being unfavorable practically. Particularly, when it is used for a solar cell, the photoelectric conversion efficiency tends to decrease, and when it is used for a transparent article such as a transparent heating element, the transparency tends to be impaired.

The present invention further provides a solar cell which comprises a substrate, and a front surface electrode, a photoelectric conversion layer and a back surface electrode formed on the substrate in this order, wherein the ZAY film is formed between the photoelectric conversion layer and the back surface electrode.

In a thin-film solar cell such as an amorphous Si solar cell, for example, when the ZAY film is used as a transparent conductive layer to be interposed between an amorphous Si layer and a back surface electrode made of a metal (e.g. Ag film), decrease in power generation efficiency can be minimized, since the light absorption of the ZAY film at the visible light region and the near infrared region is small, and the light energy will be used more efficiently.

Al in the ZAY film and the ZAY target will be solid-solved in ZnO in part or in whole, and work to form electrons which develop the electrical conductivity.

On the other hand, Y will work to decrease the carrier concentration, and to decrease the mobility as an impurity scattering source. Further, Y in the ZAY target will work also as a sintering aid.

By the actions of Al and Y, a transparent conductive film having a resistivity of from $10^{-2}$ to $10^{10}$ Ω·cm, and having a low light absorptivity, can be obtained even by sputtering at a low oxygen concentration.

Y in the ZAY film is uniformly dispersed in the film, and is present in such a state that it is solid-solved in ZnO. On the other hand, Y in the ZAY target is present as segregated, and the above-mentioned action by Y to increase the resistance will cover only a narrow area, and accordingly, the entire ZAY target will have a low resistance of a level of $10^{31}$ Ω·cm. Y in the ZAY target is present as $Y_2O_3$ or in such a state that it is solid-solved in ZnO.

BEST MODE FOR CARRYING OUT THE INVENTION

EXAMPLES

Examples 1 to 11

ZnO powder, $Al_2O_3$ powder and $Y_2O_3$ powder were prepared, and these powders were mixed in the proportions as shown in Table 1 in a ball mill. Al and Y in the column of ZAY target in Table 1 represent the contents (atomic %) of Al and Y, respectively, based on the total amount of Zn, Al and Y. Here, the composition of a ZAY target agreed with the composition of the mixture of the starting material powders.

The mixed powder was press-molded, and baked under normal pressure in the air atmosphere at 1450° C. for 3 hours, to prepare a sintered body.

Then, each sintered body was cut out into a prism of 3 mm×3 mm×30 mm, and the resistivity was measured by a four terminal measurement. The results are shown in Table 1. The unit of the resistivity is Ω·cm in the column of ZAY target in Table 1. The resistance was as low as from $10^{-3}$ to $10^{-1}$ Ω·cm in every Example.

Here, the measurement by the four terminal measurement was carried out as follows. An electric wire was soldered on both ends (faces of 3 mm×3 mm) of the sample which was cut out, said electric wire was connected to a direct-current power supply, and a constant current of 0.1 A was applied to the sample. Here, probes of a voltmeter were put at positions about 2 mm inside from either end on one face of 3 mm×30 mm, and the voltage drop (V[V]) between the probes (L[cm]:about 2.6 cm) was measured. The sectional area (S[cm$^2$]:about 0.09 cm $^2$) of the sample was measured by a micrometer. L was measured by a caliper. Then, the resistivity (ρ[cm]) was obtained from ρ=(V/0.1)×(S/L).

Then, each sintered body was cut out in a size of 6 inches in diameter and 5 mm in thickness to prepare a ZAY target.

Employing such ZAY targets and using a magnetron DC sputtering apparatus, film formation of ZAY films was carried out under such conditions that input power: 800 W, introduced gas: argon gas, pressure: $4 \times 10^{-3}$ Torr, and substrate temperature: no heating. As the substrate, a soda lime glass having a thickness of 2 mm was used. The operation was carried out so that the film thickness would be 130 nm.

During film formation, discharge was stably carried out. After the film formation, the film thickness was measured, whereupon it was about 130 nm. The sheet resistance was measured by a two point probe measurement. The resistivity was calculated from the film thickness and the sheet resistance measured. The results are shown in Table 1. The unit of the resistivity is Ω·cm in the column of ZAY film in Table 1. Here, in the measurement by the two point probe measurement, the sheet resistance of less than $10^6$ was measured by using a thin-film resistance measuring device Loresta manufactured by Mitsubishi Yuka Co., Ltd., and inserting an A type probe of two points manufactured by said corporation, and the sheet resistance of at least $10^6$ was measured by using a thin-film resistance measuring device Megaresta manufactured by Shishido Electrostatic LTD, and inserting an HA type probe of two points manufactured by said corporation.

Further, the composition of the ZAY film was analyzed by ICP. The results are shown in Table 1. Al and Y in the column of ZAY film in Table 1 represent the contents (atomic %) of Al and Y, respectively, based on the total amount of Zn, Al and Y.

As shown in Table 1, the resistance of the ZAY film increased along with increase in addition amount of Y, and varied within a range of from $10^{-2}$ to $10^{10}$ Ω·cm. The content of Y in the ZAY film was about double the content in the target.

The difference in the Y content between the ZAY target and the ZAY film is considered to be because the vapor pressure of $Y_2O_3$ is low as compared with ZnO and $Al_2O_3$.

Here, with respect to the ZAY film of each of Examples 1 to 11, the transmittance and reflectance were measured by using a spectrophotometer, and the absorptivity (excluding the absorption of the substrate) was obtained from such a relation that (transmittance)+(reflectance)+(absorptivity)= 100% (i.e. (absorptivity)=100−(transmittance)− (reflectance)). The absorptivities of incident light at 400 nm, 500 nm and 1000 nm are shown in Table 1 as representative values. 400 nm, 500 nm and 1000 nm in the column of ZAY film in Table 1 represent the absorptivities (%) of incident light at 400 nm, 500 nm and 1000 nm, respectively. The light absorptivity of the ZAY film was low and at most 4% at each wavelength of from 400 to 1000 nm. This is considered to be because the effect that the bandgap became narrow was suppressed, and the carrier electron concentration was decreased, by addition of Y.

On the other hand, with respect to the target obtained in each of Examples 1 to 11, crystal phases other than ZnO phase were analyzed by a powder x-ray diffraction analysis (using CuK$_\alpha$ ray), whereupon in Example 1, a peak of a $Y_3Al_5O_{12}$ phase and a peak of a $ZnAl_2O_4$ phase appeared, and the peak intensity of (101) face of the $Y_3Al_5O_{12}$ phase was 1.1 based on the peak intensity of (311) face of the $ZnAl_2O_4$ phase. In Examples 2 to 11, no peak of the $ZnAl_2O_4$ phase appeared (the limit of detection or below).

Examples 12 to 14

In the same manner as in Example 1, a powder mixed in proportions as shown in Table 1 was baked under normal pressure in the same manner as in Example 1, to prepare a sintered body. In Example 14, data on absorptivities of a glass substrate alone is shown.

The resistivity measured in the same manner as in Example 1 was shown in Table 1. In Example 13 wherein no Al was contained, the resistivity of the target was so high as $10^5$ Ω·cm Then, a target was prepared from each sintered body in the same manner as in Example 1. Employing such a target and using a magnetron DC sputtering apparatus, film formation was carried out under the same conditions as in Example 1.

In Example 13 wherein no Al was contained, the resistance of the target was high, and discharge could not be carried out, and accordingly film formation was impossible by DC sputtering.

In Example 12, discharge was stably carried out during film formation. After film formation, the film thickness was measured, whereupon it was about 130 nm. The resistivity was calculated in the same manner as in Example 1, and the results are shown in Table 1. In Example 12, no desired transparent conductive film of from $10^{-2}$ to $10^{10}$ Ω·cm could be obtained.

Absorptivities of incident light at 400 nm, 500 nm and 1000 nm obtained in the same manner as in Examples 1 to 11 are shown in Table 1.

TABLE 1

| | ZAY target | | | ZAY film | | | | | |
|---|---|---|---|---|---|---|---|---|---|
| Ex. | Al | Y | Resistivity | Al | Y | Resistivity | 400 nm | 500 nm | 1000 nm |
| 1 | 3.2 | 0.4 | $2.5 \times 10^{-3}$ | 3.4 | 0.8 | 0.04 | 3.0 | 1.0 | 3.6 |
| 2 | 3.2 | 1.0 | $2.4 \times 10^{-3}$ | 3.4 | 1.8 | 0.15 | 1.0 | 1.0 | 3.1 |
| 3 | 3.2 | 2.0 | $3.0 \times 10^{-3}$ | 3.4 | 3.7 | 1.6 | 0.1 | 1.0 | 2.1 |
| 4 | 3.2 | 9.5 | $3.4 \times 10^{-3}$ | 3.4 | 17.0 | 2 | 0.1 | 1.0 | 1.6 |
| 5 | 3.2 | 18.2 | $3.8 \times 10^{-3}$ | 3.4 | 31.2 | $10^5$ | 0.1 | 1.0 | 1.5 |
| 6 | 3.2 | 26.0 | $6.5 \times 10^{-3}$ | 3.4 | 43.8 | $10^8$ | 0.1 | 1.0 | 1.3 |
| 7 | 3.2 | 46.2 | $9.5 \times 10^{-2}$ | 3.4 | 71.0 | $10^{10}$ | 0.1 | 1.0 | 1.1 |
| 8 | 0.4 | 9.5 | $3.8 \times 10^{-3}$ | 0.4 | 17.0 | $10^7$ | 0.1 | 1.0 | 1.6 |
| 9 | 2.0 | 9.5 | $5.8 \times 10^{-3}$ | 2.2 | 17.0 | $10^4$ | 0.1 | 1.0 | 1.6 |
| 10 | 4.9 | 9.5 | $7.8 \times 10^{-3}$ | 5.1 | 17.0 | $10^2$ | 0.1 | 1.0 | 1.6 |
| 11 | 7.7 | 9.5 | $5.8 \times 10^{-2}$ | 7.9 | 17.0 | $10^3$ | 0.1 | 1.0 | 1.6 |
| 12 | 3.2 | 0 | $5.0 \times 10^{-3}$ | 3.4 | 0 | $10^{-3}$ | 4.5 | 1.0 | 4.8 |
| 13 | 0 | 9.5 | $1.0 \times 10^5$ | DC sputtering unfeasible | | | | | |
| 14 | — | — | — | — | — | — | 0.1 | 0.1 | 7.4 |

Example 15

On a soda lime glass substrate, film formation of a ZAY film in a thickness of 40 nm was carried out by using the ZAY target obtained in Example 4. Then, on said ZAY film, by using a ZnO target having $Ga_2O_3$ added thereto (a target having $Ga_2O_3$ incorporated therein in an amount of 5.7 wt % based on the total amount of $Ga_2O_3$ and ZnO, hereinafter referred to as GZO target), film formation of a ZnO film having $Ga_2O_3$ added thereto (a transparent conductive film having $Ga_2O_3$ incorporated therein in an amount of 5.7 wt % based on the total amount of $Ga_2O_3$ and ZnO, hereinafter referred to as GZO film) in a thickness of 25 nm was carried out.

After the film formation, heat treatment was carried out at 150° C. for 20 minutes. The visible light transmittance was 84%. Then, a metal bus bar electrode was attached to the transparent conductive film of the obtained transparent conductive film-bonded glass to prepare a transparent heating element A. The sheet resistance of the obtained transparent heating element A was $1200\Omega/\square$.

One sample of said transparent heating element A was left to stand in a constant temperature bath of 100° C. for 30 days, whereupon the sheet resistance after 30 days was 1220 $\Omega/\square$. The rate of increase was 1.7%, and the proportion of the change was small. On the other hand, another sample of the transparent heating element A was left to stand in a constant temperature and constant humidity bath of 60° C. at a relative humidity of 90% for 30 days, whereupon the sheet resistance after 30 days was 1225 $\Omega/\square$. The rate of increase was 2.1%, and the proportion of the change was small.

Further, a transparent heating element B was prepared in the same manner as mentioned above except that no ZAY film was formed as the base film. The sheet resistance of the obtained transparent heating element A was 1300 $\Omega/\square$. The sheet resistance was different from that of the transparent heating element A because the resistance increased during heat treatment.

The transparent heating element B was left to stand in a constant temperature bath and in a constant temperature and constant humidity bath in the same manner as the transparent heating element A. The sheet resistance was 1340 $\Omega/\square$ after being left to stand in a constant temperature bath of 100° C. for 30 days, and the rate of increase was so high as 3.1%. Further, the sheet resistance was 1400 $\Omega/\square$ after being left to stand in a constant temperature and constant humidity bath of 60° C. at a relative humidity of 90% for 30 days, and the rate of increase was so high as 7.7%.

Example 16

A transparent heating element C was prepared in the same manner as the preparation of the transparent heating element A, except that film formation of a ZAY film in a thickness of 40 nm was carried out on the GZO film of 25 nm in the same manner as in Example 15 in the step of preparing the transparent heating element A of Example 15. Here, the visible light transmittance of the transparent conductive film-bonded glass before the preparation of the transparent heating element C was 83%.

The sheet resistance of the obtained transparent heating element C was $1200\Omega/\square$.

The transparent heating element C was left to stand in a constant temperature bath and in a constant temperature and constant humidity bath in the same manner as the transparent heating element A. The sheet resistance was 1205 $\Omega/\square$ after being left to stand in a constant temperature bath of 100° C. for 30 days, the rate of increase was 0.4%, and the proportion of the change was extremely low. Further, the sheet resistance was 1208 $\Omega/\square$ after being left to stand in a constant temperature and constant humidity bath of 60° C. at a relative humidity of 90% for 30 days, the rate of increase was 0.7%, and the proportion of the change was extremely low.

Example 17

Film formation of a $SnO_2$ film having a irregular surface was carried out on a glass substrate by an atmospheric pressure CVD method. Then, an amorphous Si layer (a-Si:H layer) having a p-i-n junction, as a photoelectric conversion layer, was laminated in a thickness of 400 nm thereon by a plasma CVD method. Here, in the plasma CVD method, as starting material gases, $SiH_4$ and $B_2H_6$ were used for the player formation, $SiH_4$ for the i layer formation, and $SiH_4$ and $PH_3$ for the n layer formation.

Then, on said photoelectric conversion layer, film formation of a ZAY film in a thickness of 50 nm was carried out in the same manner as in Example 3 by using the ZAY target obtained in Example 3. Finally, an Ag film as a back surface electrode was laminated in a thickness of 200 nm thereon, to prepare a solar cell A.

On the other hand, a solar cell was prepared in the same manner as mentioned above except that a ZnO film having $Al_2O_3$ added thereto (a transparent conductive film having $Al_2O_3$ incorporated therein in an amount of 2 wt % based on the total amount of $Al_2O_3$ and ZnO) was used instead of the ZAY film.

The obtained solar cells A and B were irradiated with light of AM-1 (the sunbeam which reaches the earth is weakened by the atmospheric air. The amount of the air for passage in the atmosphere is called air mass, the amount of the air for passage at right angles of incidence from the zenith is referred to as AM-1, which is referred to as AM-0 in the outer space) by a solar simulator, and the volt-ampere characteristic was measured, and short circuit current, open circuit voltage and fill factor were measured to obtain the photoelectric conversion efficiency. As a result, the photoelectric conversion efficiency of the solar cell A was 1.12 when the photoelectric conversion efficiency of the solar cell B was 1.00, and the solar cell using the ZAY film had a higher photoelectric conversion efficiency.

INDUSTRIAL APPLICABILITY

The ZAY target of the present invention can be used for a DC sputtering method. Further, by using the ZAY target, a transparent conductive film having a low light absorptivity and having a resistivity of from $10^{-2}$ to $10^{10}$ $\Omega \cdot cm$ can be stably produced.

The ZAY film of the present invention has a proper resistivity, and at the same time, has a low light absorptivity. Accordingly, the ZAY film of the present invention is suitable for a transparent conductive film used by combination with an Ag film as a back surface electrode of a solar cell, or a transparent conductive film to be used for a transparent heating element.

Further, according to the present invention, a transparent conductive film having a resistivity of from $10^{-2}$ to $10^{10}$ $\Omega \cdot cm$ and having a low light absorptivity can be produced with a high productivity.

What is claimed is:

1. A sputtering target which comprises an oxide containing Zn, Al and Y, wherein the sputtering target comprises from 3.2 to 15.0 atomic % of Al and from 26.0 to 75.0 atomic % of Y, based on the total amount of Zn, Al and Y.

2. The sputtering target according to claim 1 which has a resistivity of at most $10^{-1}$ $\Omega \cdot cm$.

3. A method for producing a transparent conductive film, which comprises sputtering the sputtering target of claim 1, thereby providing a transparent conductive film.

4. The sputtering target of claim 1, wherein the Al is present in an amount of from 3.2 to 8.0 atomic %, based on the total amount of Zn, Al, and Y.

5. The sputtering target of claim 1, wherein the atomic ratio of Y/Al in the sputtering target is from 0.1 to 25.

6. The sputtering target of claim 1, wherein the sputtering target has a $Y_3Al_5O_{12}$ phase having a garnet structure.

7. The method of claim 3, wherein the transparent conductive film is formed in an atmosphere having a content of oxygen gas which is at most 3 vol %.

8. A sputtering target which comprises an oxide comprising Zn, Al and Y, wherein the sputtering target comprises from 0.2 to 15.0 atomic % of Al and from 9.5 to 75.0 atomic % of Y, based on the total amount of Zn, Al and Y.

* * * * *